(12) United States Patent
Park

(10) Patent No.: US 7,666,755 B2
(45) Date of Patent: Feb. 23, 2010

(54) METHOD OF FORMING DEVICE ISOLATION FILM OF SEMICONDUCTOR DEVICE

(75) Inventor: Jin Ha Park, Echeon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 191 days.

(21) Appl. No.: 11/842,715

(22) Filed: Aug. 21, 2007

(65) Prior Publication Data

US 2008/0153255 A1    Jun. 26, 2008

(30) Foreign Application Priority Data

Dec. 20, 2006    (KR) .................. 10-2006-0131295

(51) Int. Cl.
*H01L 21/00* (2006.01)
(52) U.S. Cl. .................. 438/424; 438/427; 438/433; 438/435; 438/445; 438/788; 257/E21.324; 257/E21.538; 257/E21.546; 257/E21.549; 257/E21.551
(58) Field of Classification Search .................. 438/296, 438/392, 424–445, 561, 949, 659, 788; 257/E21.58, 257/573, 582, 651, E21.324, 538–551
See application file for complete search history.

(56) References Cited

U.S. PATENT DOCUMENTS

| 4,666,556 | A | * | 5/1987 | Fulton et al. ............... 438/431 |
| 4,994,409 | A | * | 2/1991 | Yoon et al. .................. 438/9 |
| 5,618,751 | A | * | 4/1997 | Golden et al. ............... 438/392 |
| 5,686,345 | A | * | 11/1997 | Harmon et al. ............. 438/702 |
| 5,702,977 | A | * | 12/1997 | Jang et al. .................... 216/38 |
| 5,719,085 | A | * | 2/1998 | Moon et al. .................. 438/424 |
| 5,721,174 | A | * | 2/1998 | Peidous ....................... 438/445 |
| 5,763,315 | A | * | 6/1998 | Benedict et al. ............. 438/424 |
| 5,780,346 | A | * | 7/1998 | Arghavani et al. .......... 438/296 |
| 5,783,476 | A | * | 7/1998 | Arnold ........................ 438/425 |
| 5,811,347 | A | * | 9/1998 | Gardner et al. ............. 438/435 |
| 5,849,625 | A | * | 12/1998 | Hsue et al. .................. 438/424 |
| 5,953,621 | A | * | 9/1999 | Gonzalez et al. ........... 438/424 |
| 6,110,793 | A | * | 8/2000 | Lee et al. .................... 438/400 |
| 6,194,285 | B1 | * | 2/2001 | Lin et al. .................... 438/424 |
| 6,207,532 | B1 | * | 3/2001 | Lin et al. .................... 438/424 |
| 6,228,726 | B1 | * | 5/2001 | Liaw .......................... 438/294 |
| 6,258,693 | B1 | * | 7/2001 | Choi ........................... 438/423 |
| 6,323,106 | B1 | * | 11/2001 | Huang et al. ................ 438/433 |
| 6,541,350 | B2 | * | 4/2003 | Chen .......................... 438/424 |
| 6,689,665 | B1 | * | 2/2004 | Jang et al. ................... 438/296 |
| 6,709,951 | B2 | * | 3/2004 | Beyer et al. ................. 438/424 |
| 7,060,610 | B2 | * | 6/2006 | Lee ............................. 438/659 |
| 7,217,632 | B2 | * | 5/2007 | Gyun .......................... 438/424 |
| 2002/0009855 | A1 | * | 1/2002 | Kim .......................... 438/278 |
| 2005/0142797 | A1 | * | 6/2005 | Ahn ........................... 438/424 |

* cited by examiner

*Primary Examiner*—Michael S Lebentritt
(74) *Attorney, Agent, or Firm*—Saliwanchik, Lloyd & Saliwanchik

(57) ABSTRACT

A method of forming a device isolation film of a semiconductor device is provided. The method of forming a device isolation film of a semiconductor device according to an embodiment includes forming the device isolation film by ion-implanting insulation materials inside of a trench formed on a semiconductor substrate.

18 Claims, 4 Drawing Sheets

METHOD OF FORMING DEVICE ISOLATION FILM OF SEMICONDUCTOR DEVICE

CROSS-REFERENCE TO RELATED APPLICATION

The present application claims the benefit under 35 U.S.C. §119 of Korean Patent Application No. 10-2006-0131295, filed Dec. 20, 2006, which is hereby incorporated by reference in its entirety.

BACKGROUND

As semiconductor technology progresses, high speed and highly integrated semiconductor devices are being developed, and thus a demand for pattern fitness has grown significantly.

Today, a process of forming a semiconductor device involves a device isolation forming process for establishing an active region in which an active device, such as a transistor, will be formed. Typically, the device isolation forming process used to form a device isolation film of a semiconductor device is a shallow trench isolation process (STI) that can widen an area of an active region due to a reduction of a design rule of a device, instead of a local oxidation of silicon (LOCOS).

The device isolation film formation by means of the STI process is a method of selectively etching a silicon wafer and forming a trench and then filling insulation materials in the trench.

Hereinafter, a process of forming a device isolation film of a semiconductor device according to the related art will be described with reference to FIG. 1 and FIG. 2.

Referring first to FIG. 1, a pad oxide film 2 and a pad nitride film 3 are formed on a semiconductor substrate 1.

Then, a trench 4 is formed on the semiconductor substrate 1 by forming a photoresist pattern (not shown) defining a device isolation region and then etching the pad nitride film 3, the pad oxide film 2, and the semiconductor substrate 1 using the photoresist pattern as an etch mask.

Referring to FIG. 2, an oxide film 5 is deposited on the semiconductor substrate 1 to fill the inside of the trench. The oxide film 5 is deposited at a thickness sufficient to form the oxide to the upper surface of the pad nitride film 3 while sufficiently filling the trench 4.

Then, the oxide film 5 is planarized by means of a chemical mechanical polishing (CMP) process. The CMP process is performed until the pad nitride film 3 is exposed and then is performed to remove the pad nitride film 3 and the pad oxide film 2, thereby completing a device isolation film.

However, as the design rule dimensions of the semiconductor device are reduced, the aspect ratio of the trench 4 is very large so that a void 6 may be generated in the trench when filling the trench 4 with the oxide film 5.

The void 6 is exposed when the oxide film 5 is planarized by means of the CMP so that in a subsequent gate forming process, a gate material may remain in the void 6. As a result of the void, the remaining gate material may be electrically connected to the gate. Such a defect may cause the characteristics of the semiconductor device to deteriorate and reduce reliability of the device.

In addition, the device isolation insulating film formed of the oxide film according to the related art process generates an electric field concentration effect which increases at corner portions thereof so that leakage current increases.

BRIEF SUMMARY

Embodiments of the present invention provide a method of forming a device isolation film of a semiconductor device capable of preventing a void in the device isolation film. In an embodiment, the device isolation film can be formed by burying nitrogen in a trench of a semiconductor substrate by means of an ion implant method.

A method of forming a device isolation film of a semiconductor device according to an embodiment can include: stacking a pad oxide film, a pad nitride film, and a pad TEOS film on a semiconductor substrate; forming a trench by etching the pad oxide film, the pad nitride film, the pad TEOS film, and a portion of the semiconductor substrate; forming and then planarizing an insulating layer in the trench using the TEOS film as a mask; and removing the pad oxide film, the pad nitride film, and the pad TEOS film to provide a device isolation film on the substrate.

DETAILED DESCRIPTION

Hereinafter, a method of forming a device isolation film according to embodiments of the present invention will be described with reference to the accompanying drawings.

FIGS. 3 to 8 show a method of forming a device isolation film of a semiconductor device according to embodiments.

Figure 1:
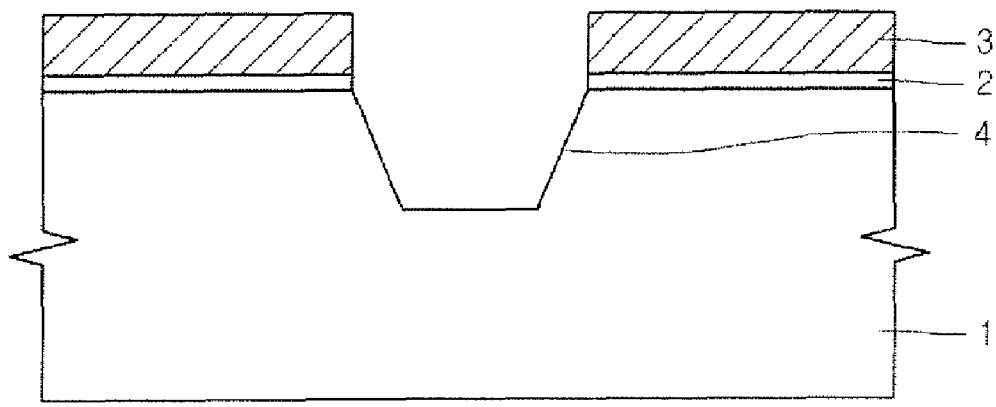
FIGS. 1 and 2 are cross-sectional views showing a method of forming a device isolation film of a semiconductor according to the related art.
Figure 2:
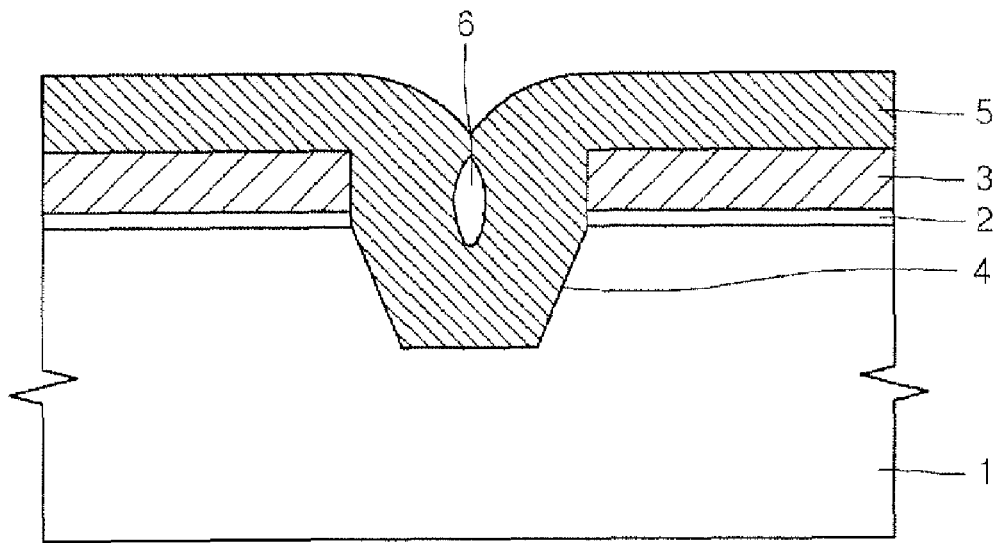
Figure 3:
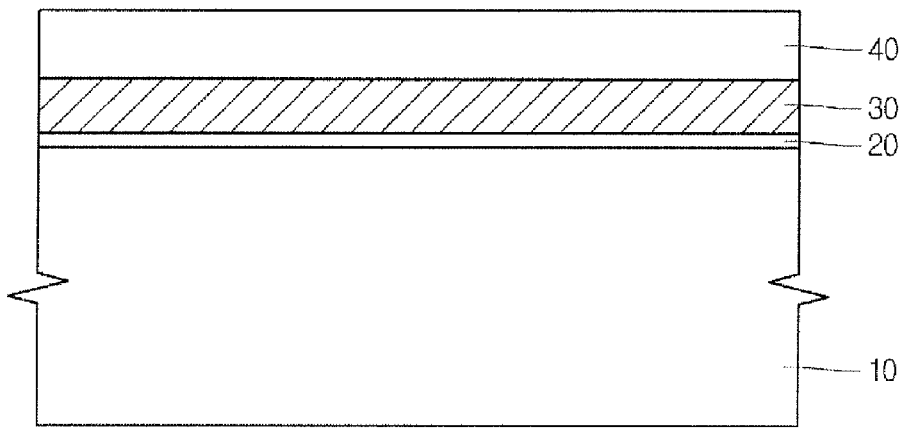
FIGS. 3 to 8 are cross-sectional views showing a method of forming a device isolation film of a semiconductor device according to embodiments of the present invention.

Referring to FIG. 3, a pad oxide film 20, a pad nitride film 30, and a pad TEOS film 40 can be sequentially formed on a semiconductor substrate 10. The pad oxide film 20, pad nitride film 30, and pad TEOS film 40 are used as mask layers for forming a shallow trench for isolation.

The pad oxide film 20 can be formed by means of a CVD (chemical vapor deposition) process or a thermal oxidation process. In an embodiment, the pad oxide film 20 can be formed at a thickness of 1 nm to 100 nm by means of a thermal oxidation process.

The pad nitride film 30 can be formed by a CVD process. For example, the pad nitride film 50 can be formed by a low pressure CVD (LPCVD). In an embodiment, the pad nitride film 30 can be formed at a thickness of 10 nm to 1000 nm by means of the LPCVD.

The pad TEOS film 40 can be formed by means of a CVD process. In an embodiment, the pad TEOS film 40 can be formed at a thickness of 10 nm to 1000 nm by means of the CVD process.

Figure 4:
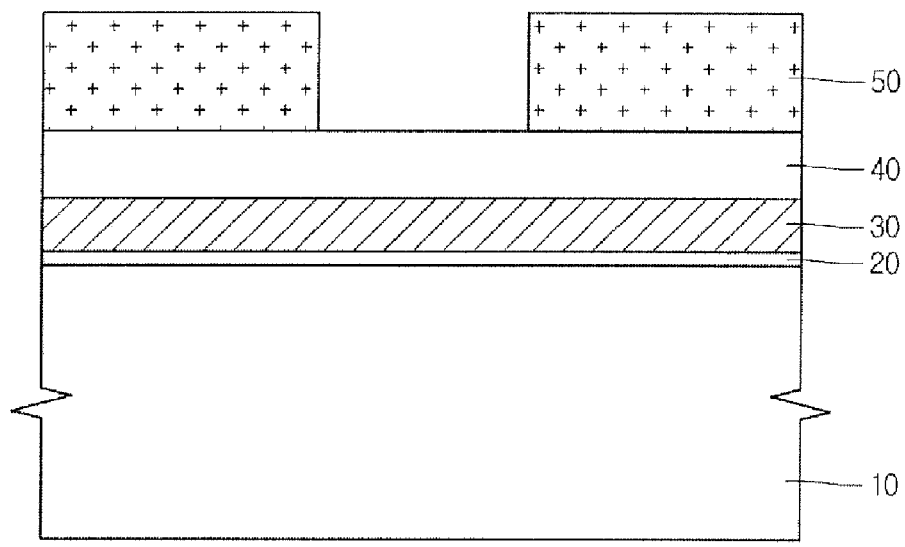

Referring to FIG. 4, a photoresist pattern 50 can be formed by coating a photoresist film on the TEOS film formed on the semiconductor substrate 10 and exposing and developing the photoresist film.

Figure 5:
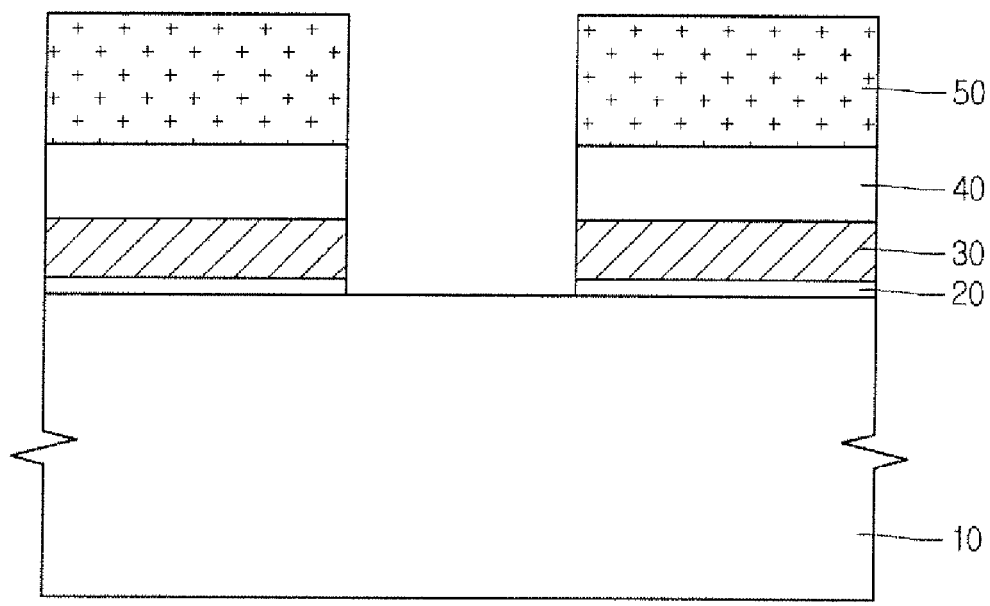

Referring to FIG. 5, the surface of the semiconductor substrate 10 can be selectively exposed by etching the pad TEOS film 40, the pad nitride film 30, and the pad oxide film 20 using the photoresist pattern 50 as an etch mask.

Figure 6:
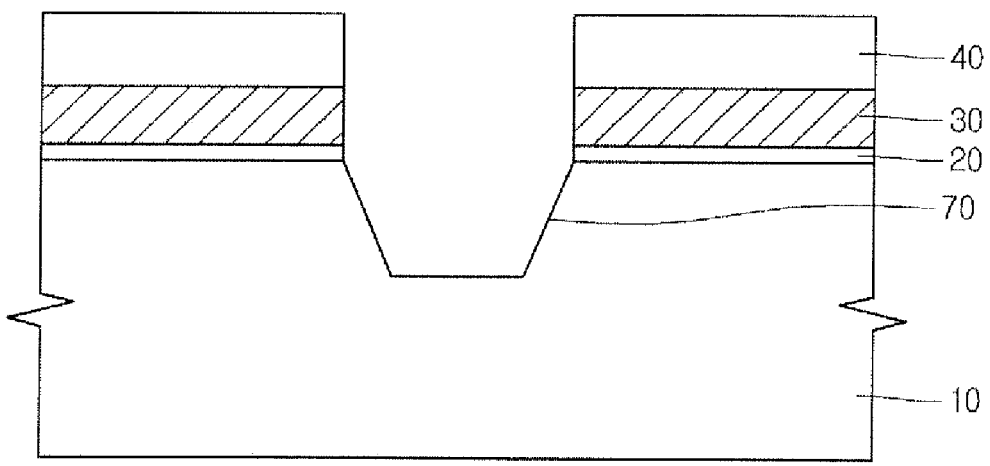

Referring to FIG. 6, a trench 70 can be formed on the semiconductor substrate 10 by performing an etching process using the pad TEOS film 40 as the etch mask after removing the photoresist pattern 50.

Figure 7:
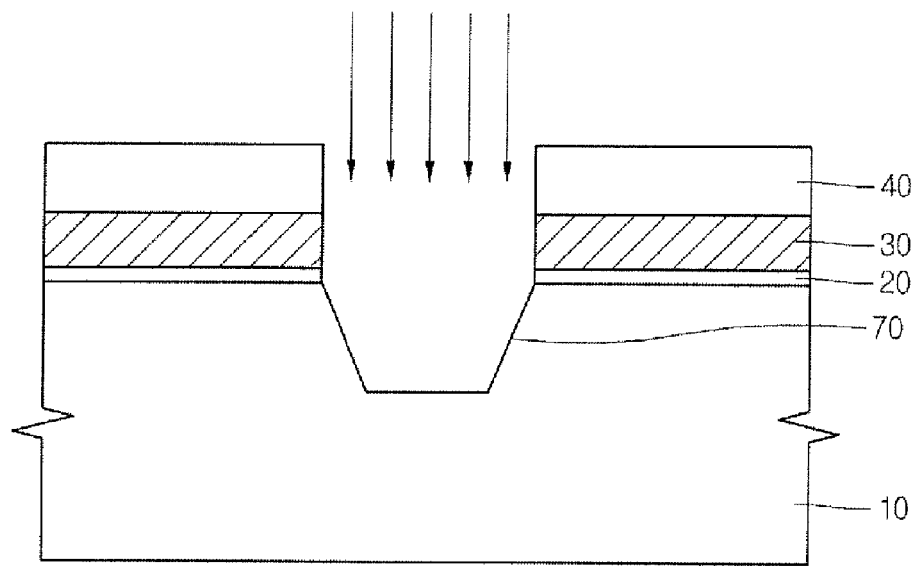
Figure 8:
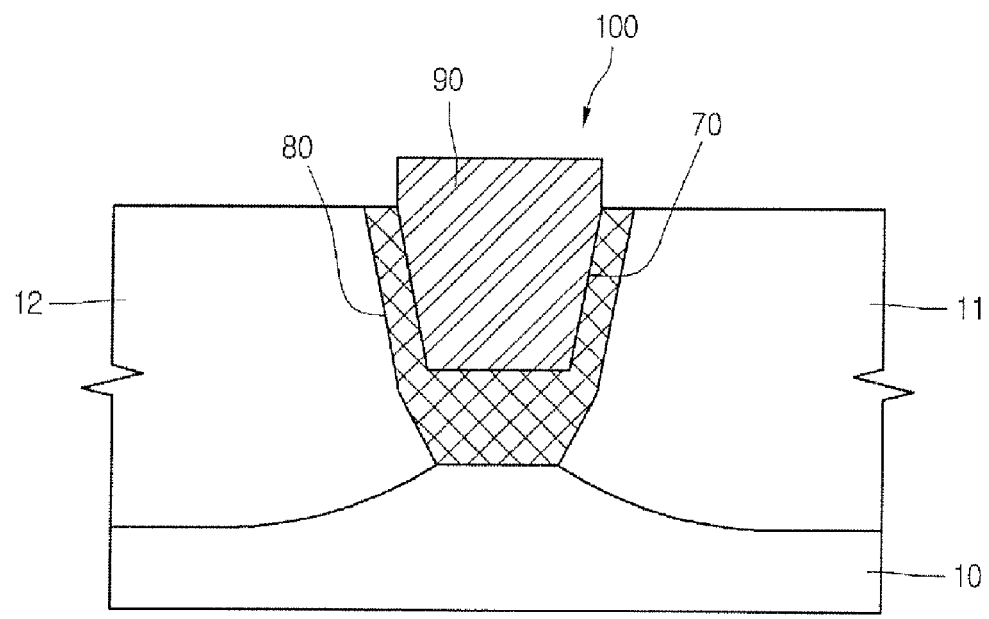

Referring to FIGS. 7 and 8, an insulating layer 90 can be formed in the trench 70 formed on the semiconductor substrate 10.

The insulating layer 90 can be formed by an ion-implant method. For example, the insulating layer can be formed by ion-implanting nitrogen.

When the insulating layer 90 is being formed, the nitrogen can be implanted deeper than the depth of the trench 70 by controlling the ion implant conditions of the nitrogen.

That is, the insulating layer 90 can be formed by implanting ions into the semiconductor substrate 10 to form a barrier film 80 of implanted nitrogen around the trench and the insulating layer 90.

Specifically, the nitrogen of the insulating layer 90 can be gap filled at an implant dose of $10^{15}$~$10^{16}$ ions/cm$^2$ under energy of 1 KeV~10 KeV.

In particular, the nitrogen can be implanted at a high concentration so that a void is not generated inside the trench 70.

Referring to FIG. 8, after the insulating layer 90 is formed in the inside of the trench, the insulating layer 90 can be planarized by means of a CMP process.

In the above described CMP process, the pad nitride film 30 can be used as an etch stopping layer so that the insulating layer 90 subjected to the CMP process can be formed to the height of the pad nitride film 30 formed on the semiconductor substrate 10. The pad TEOS film 40 is removed by the CMP process.

Thereafter, with the removal of the pad oxide film 20, the pad nitride film 30, and the pad TEOS film 40, the device isolation film 100 is provided on the semiconductor substrate 10.

In addition, an N-well 11 and a P-well 12 can be formed by performing an impurity ion implant process on the semiconductor substrate 10.

As the impurity for forming the N-well 11 and the P-well 12, group V elements such as phosphorous or arsenic and group III elements such as boron are used.

In an embodiment, the ions implanted in the N-well 11 and the P-well 12 can be implanted on the order of $10^{12}$~$10^{13}$ ions/cm$^2$.

If the impurity is implanted onto the semiconductor substrate 10, the N-well 11 and the P-well 12 can be isolated by means of the device isolation film 100.

In a further embodiment, the device isolation film 100 is formed of a high concentration of nitrogen and the N-well 11 and the P-well 12 are formed of a relatively low concentration of nitrogen so that the device isolation characteristics can be improved.

In addition, in forming the insulating layer 90, nitrogen is implanted deeper than the trench 70 to form the barrier film 80 around the trench 70 so that the ions, such as phosphorous, arsenic, and boron, are inhibited from infiltrating to the device isolation film 100, making it possible to improve the isolation characteristics of the devices formed on the N-well 11 and the P-well 12.

Also, since the nitrogen can be deposited by means of the ion implant method, the device isolation film 100 can inhibit formation of a void therein.

According to embodiments, the device isolation film 100 is formed of nitrogen so that it shields an effect of electric field, making it possible to prevent the generation of leakage current.

Also, the nitrogen is implanted deeper than the trench 70 so that the isolation between the devices can be made certain, and the effect of electric field to be concentrated on the corner regions of the device isolation film 100 is shielded. Thus, it is possible to improve reliability of the device.

In addition, embodiments of the present invention can form the trench to be shallow because ions are implanted deeper than the bottom surface of the trench.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a device isolation film of a semiconductor device, comprising:
   forming mask layers on a semiconductor substrate;
   patterning the mask layers to expose device isolation regions of the semiconductor substrate;
   forming a trench in the exposed isolation regions of the semiconductor substrate;
   forming an insulating layer in the trench by performing an ion implant method to fill the trench, wherein a portion of the insulating layer forms a barrier layer around the trench.

2. The method according to claim 1, wherein forming mask layers on a semiconductor substrate comprises:
   sequentially forming a pad oxide film, a pad nitride film, and a pad TEOS film on the semiconductor substrate.

3. The method according to claim 2, wherein patterning the mask layers to expose device isolation regions of the semiconductor substrate comprises:
   forming a photoresist pattern on the pad TEOS film; and
   etching the pad TEOS film, the pad nitride film, and the pad oxide film using the photoresist pattern to selectively expose the device isolation regions of the semiconductor substrate.

4. The method according to claim 3, wherein forming a trench comprises:
   removing the photoresist pattern from the pad TEOS film; and
   etching the exposed semiconductor substrate using the stacked pad TEOS film, pad nitride film, and pad oxide film as an etch mask.

5. The method according to claim 1, wherein the trench is formed to be shallow.

6. The method according to claim 1, wherein performing the ion implant method comprises implanting nitrogen into the trench.

7. The method according to claim 6, wherein the nitrogen is also implanted deeper than the trench thereby forming the barrier layer.

8. The method according to claim 6, wherein the nitrogen is implanted at an ion implantation dose of $10^{15} \sim 10^{16}$ ions/cm$^2$ using an ion implantation energy of 1 KeV~10 KeV.

9. The method according to claim 1, further comprising planarizing the insulating layer.

10. The method according to claim 9, wherein planarizing the insulating layer comprises performing a chemical mechanical polishing (CMP) process.

11. The method according to claim 10, wherein the mask layers comprise a sequentially stacked oxide film, nitride film, and pad TEOS film, wherein performing the CMP process comprises:
　　using the nitride film as an etch stopping layer, thereby removing the TEOS film.

12. The method according to claim 1, wherein the insulating layer comprises nitrogen.

13. The method according to claim 1, further comprising forming an N-well or a P-well by implanting impurity into the semiconductor substrate.

14. The method according to claim 13, wherein the impurity is selected from the group consisting of phosphorous, boron, and arsenic.

15. The method according to claim 13, wherein the ion implantation dose of the impurity is $10^{12} \sim 10^{13}$ ions/cm$^2$.

16. A method of forming a device isolation film of a semiconductor device, comprising:
　　forming a shallow trench in a semiconductor substrate;
　　implanting ions for an insulating layer into the shallow trench to fill the trench, wherein a portion of the implanted ions is implanted deeper than the trench thereby forming a barrier layer around the trench.

17. The method according to claim 16, wherein implanting ions for an insulating layer comprises implanting nitrogen in the trench.

18. The method according to claim 17, wherein the nitrogen is implanted at a dose of $10^{15} \sim 10^{16}$ ions/cm$^2$ using an ion implantation energy of 1 KeV~10 KeV.

* * * * *